(12) United States Patent
Jun et al.

(10) Patent No.: US 6,417,544 B1
(45) Date of Patent: Jul. 9, 2002

(54) DIODE-LIKE PLASMA INDUCED DAMAGE PROTECTION STRUCTURE

(75) Inventors: Cai Jun; Yao Pei; He Can Zhong, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/877,751

(22) Filed: Jun. 11, 2001

(51) Int. Cl.$^7$ ............................................. H01L 23/62
(52) U.S. Cl. ........................ 257/360; 257/356; 438/237; 438/710
(58) Field of Search .................... 438/237, 707–711, 438/714; 257/360, 355–356

(56) References Cited

U.S. PATENT DOCUMENTS

| | | | | |
|---|---|---|---|---|
| 5,959,311 A | * | 9/1999 | Shih et al. ................... | 257/355 |
| 6,013,927 A | | 1/2000 | Bothra et al. ................ | 257/328 |
| 6,028,324 A | | 2/2000 | Su et al. ....................... | 257/48 |
| 6,054,740 A | | 4/2000 | Barret ........................ | 257/355 |
| 6,057,578 A | | 5/2000 | Aiello et al. ................. | 257/355 |
| 6,075,276 A | | 6/2000 | Kitamura .................... | 257/481 |
| 6,353,235 B1 | * | 3/2002 | Watanabe ................... | 257/666 |

* cited by examiner

*Primary Examiner*—Jey Tsai
(74) *Attorney, Agent, or Firm*—George O. Saile; Rosemary L.S. Pike

(57) ABSTRACT

A novel structured for a diode-like PID protection (DLPP) device structure and process are described. An N-well, three associate N+ regions and a P+ region are formed on a P substrate. The DLPP is structured as a butting diode with a polysilicon gate above the butting region. The gate is connected to a metal antenna element and to the zener like trigger element of the device. The N-well functions as a resistor and capacitor buffer between the poly gate and antenna and the substrate. The antenna picks up a portion of the plasma charge to provide a gate voltage. There is an inversion layer or accumulation layer for positive or negative plasma charge formed under the poly gate. The junction of the effective zener diode is found in the interface between the N-type inversion layer and P+, or N+ and P-type accumulation layer. Changing the shape and the size of the antenna changes the gate voltage, and subsequently the trigger voltage of the DLPP. During normal IC operation, any charge on the poly gate or associated antenna has been discharged through the N-well resistor and therefore no channel exists under the poly gate minimizing any device leakage. An alternative embodiment uses a N doped substrate with appropriately doped well and contact regions.

51 Claims, 7 Drawing Sheets

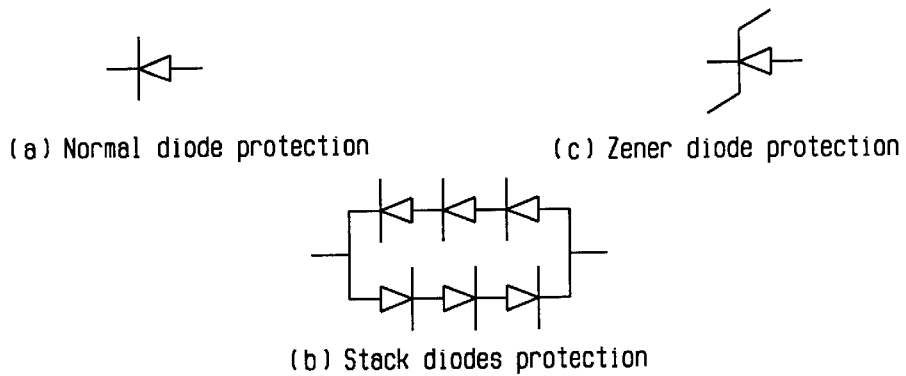
(a) Normal diode protection  (c) Zener diode protection
(b) Stack diodes protection
*FIG. 1 — Prior Art*
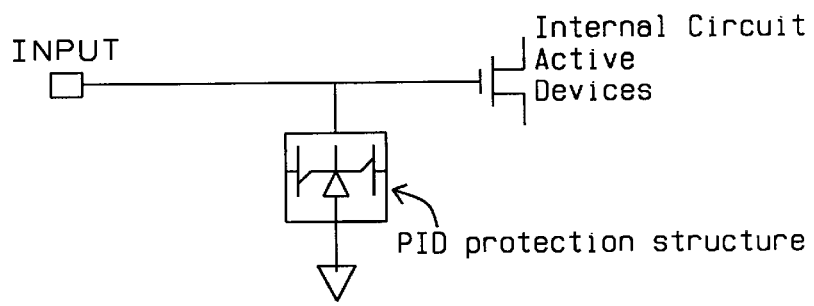
*FIG. 2*
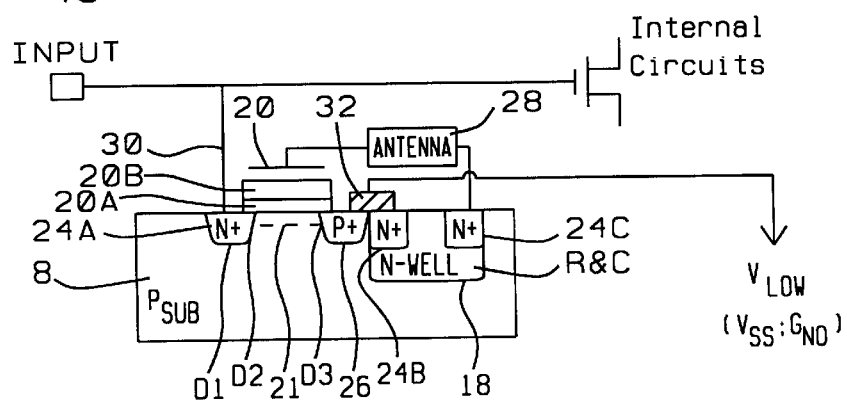
*FIG. 3A*

DIODE-LIKE PLASMA INDUCED DAMAGE PROTECTION STRUCTURE

BACKGROUND OF THE INVENTION (1) Field of the Invention

The present invention relates generally to a structure and manufacturing process of a semiconductor device which provides protection from plasma induced damage during integrated circuit device processing and more particularly to a semiconductor diode like device with a controllable trigger voltage to optimize the protection against plasma induced damage for different process requirements.

(2) Description of Prior Art

As is well known in the art, semiconductor devices are fabricated on a semiconductor substrate that is subjected to numerous processing operations. By way of example, a semiconductor device is typically subjected to several plasma etching operations, which are designed to pattern the various substrate, oxide and metallization layers and construct the desired circuit layout. Although plasma etching has become the etching process of choice, the intense energies used to create the etching plasma has had a degrading effect on thin sensitive gate oxides that lie under gate electrodes of a given circuit design. Specifically, the plasma that is generated in etching chambers is designed to bombard a layer being etched with a high concentration of electrons and positively charged ions. Unfortunately, these electrons and positively charged ions are known to induce intense currents through the gate oxides, which necessarily produce oxide degrading traps in the gate oxides.

As feature sizes for device decrease, the thickness of gate oxide layers decreases, thereby exacerbating the adverse impact of plasma charging damage. A conventional approach to the plasma charging damage protection comprises the formation of a diode as typified in FIG. 1A, connected to the polycrystatine silicon layer, i.e., gate electrode, thereby providing a discharge path for electrical charging during plasma processing.

The avalanche breakdown voltage of a diode with shallow trench isolation (STI) has been increased to the level where these devices are no longer very effective for plasma induced damage (PID) protection in deep-quarter-micron process. In this situation, the breakdown voltage of the diode tends to be higher than the gate oxide breakdown voltage. As seen in FIG. 7A, thin gate oxide breakdown is about −6.7 volts for a 0.25 um device. As shown in FIG. 7B, typical normal diode breakdown is about −12.7 volts, well above the breakdown level of the gate oxide. Therefore, it is very useful to have a new type of diode like device with a low and controllable trigger voltage for to different PID protection requirements.

Other structures have been used to protect against plasma damage. As shown in FIG. 1B, diodes stacked in parallel are sometimes used. This can have the effect of reducing the point where current flows, i.e. effectively reducing breakdown voltage, but has the problem of leakage current flow during normal device measurements and/or operation. FIG. 1C represents zener diode device X protection, which also has the potential problem of leakage current during normal measurements and/or operation. Again, it is very useful to have a new type of diode like device with a low and controllable trigger voltage and improved leakage characteristics for different PID protection requirements.

The following patents describe ESD protection devices.

U.S. Pat. No. 6,075,276 (Kitamura) discloses a protection circuit using zener diodes.

U.S. Pat. No. 6,057,578 (Aiello et al.) shows a protection circuit with zener diodes.

U.S. Pat. No. 6,054,740 (Barret), U.S. Pat. No. 6,028,324 (Su et al.) and 6,013,927 (Bothra et al.) show related protection circuits.

SUMMARY OF THE INVENTION

Accordingly, it is the primary objective of the invention to provide a novel, effective structure and manufacturable method for protecting integrated circuits, in particular field effect transistor devices, from damage caused by plasma processes used during manufacturing.

It is a further objective of the invention to improve plasma induced damage (PID) protection by enabling the protection voltage threshold to be varied to meet process and device design requirements.

In addition, it is an objective of this invention to minimize or eliminate stress in gate oxides caused by current flow induced by plasma processes thereby maintaining gate oxide integrity.

It is yet another object of the invention to provide a manufacturable method for forming the PID protection structure while maintaining the required operating characteristics of the devices being protected.

The above objectives are achieved in accordance with the embodiments of the invention that describes a process and novel structure for a diode-like PID protection (DLPP) device. Beginning with a semiconductor substrate, typically P doped, a N-well, two N-well N+ contact regions, and substrate N+ and P+ contact regions are formed. In the invention, the DLPP has a metal layer disposed as a dummy antenna connected to a polysilicon (poly) gate. The DLPP is structured as a butting diode with a polysilicon layer gate element above the butting region. There is a N-well resistor (R) and capacitor (C) formed by the inherit electrical characteristics of the N-well, connected between the poly gate and P-substrate as a RC buffer element. The structure is completed with appropriate metal conductors for the electrical connection system. The DLPP has a function of a controllable gate with Zener-liked-trigger, in which the dummy antenna picks up a portion of the plasma charge to provide a gate voltage for the gate of the DLPP. There is a N type inversion layer or P type accumulation layer formed under the poly gate for positive or negative plasma charge. The junction of the zener diode is found in the interface between the N-type inversion layer and P+ substrate contact, or N+ substrate contact region and P-type accumulation layer. Changing the shape and the size of the dummy antenna changes the amount of charge acquired, and subsequently the trigger voltage of the DLPP. During normal IC operation, any accumulated charge with the poly gate and associated antenna is discharged through the N-well resistor (R), and therefore no channel inversion or accumulation layer is developed under the poly gate. Thus, no leakage problem is found with this structure during testing or normal operation.

Another embodiment of the invention uses a N doped substrate with a P well, two associated P+P-well contact regions and a N+ and P+ substrate contact region to provide improved PID protection. For this embodiment the second voltage source is typically Vdd.

BRIEF DESCRIPTION OF THE DRAWINGS

FIG. 1A through 1C are schematic representations of prior art PID protection devices representing (1A) a normal diode, (1B) stacked diodes, and (1C) a zener diode.

FIG. 2 is a simplified schematic representation of the invention diode-like PID protection structure (DLPP) showing the device location between the input bonding pad and the active circuits.

FIG. 3A is a simplified cross section of one embodiment of the invention for a P type substrate showing the main electrical elements.

FIG. 7A shows typical breakdown characteristics for active device gate oxide, FIG. 7B shows standard diode breakdown characteristics, and FIG. 7C shows the controllable trigger voltage characteristics of the invention protection device.

DESCRIPTION OF THE PREFERRED EMBODIMENTS

Figure 3B:
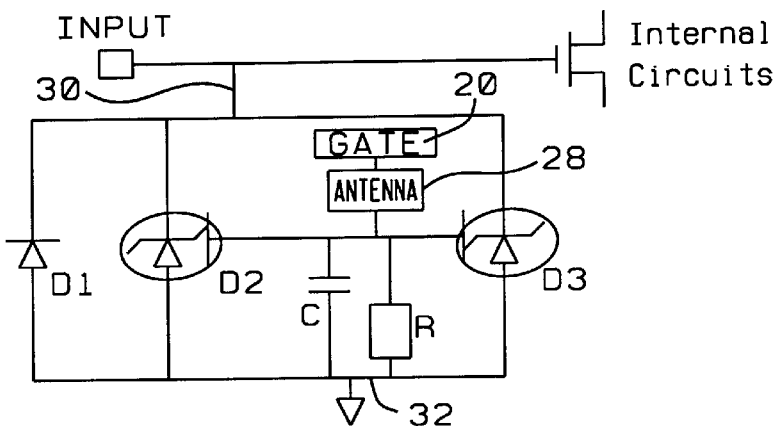
FIG. 3B is an equivalent circuit of the embodiment shown in FIG. 3A.

FIG. 2 shows a representation of the conceptual electrical schematic showing the general location of the diode-like plasma induced damage protection structure (DLPP). As depicted, the diode like device with zener like trigger characteristics is inserted electrically between the internal active circuit input pad and a second voltage source, typically the substrate bias or ground. A u potential plasma induced damage event will trigger the protection device shunting charge, or current, to. the second voltage location, typically ground for a P substrate device. FIG. 3A shows a simplified cross section of one embodiment of the invention for a P substrate device illustrating the principle electrical elements. Shown is a P doped substrate 8 with a N+ contact region 24A connected to the active device input pad, and a polysilicon (poly) gate element 20 with oxide insulator 20A with a typical thickness of between 40 and 180 Å and polysilicon conductor 20B with a typical thickness of between 2000 to 3000 Å. The gate 20 is connected to a metal conduction system 28 containing a dummy antenna for collecting charge during plasma process operations. The gate/antenna conductor 28 is connected to a N+ contact region 24C in a N-well 18. The antenna shape and size determines the trigger voltage level of the DLPP device. The channel like charge layer 21 under the poly gate 20 will be either a P accumulation charge layer for a negative gate voltage or plasma charge, or a N inversion layer for a positive gate voltage or plasma charge. The D2 device junction is formed between the P accumulation layer 21 and the N+ substrate contact element 24A for positive gate voltage, and the D3 device junction is formed between the N type inversion layer 21 and the P+ substrate contact region 26 for positive gate voltage. This device design structure thereby provides protection for either negative or positive plasma charge. A conductor 32 connects the P+ substrate contact 26 and the N+ low voltage N-well contact 24B to either Vss or ground. Diode D1 is formed with the cathode being the N+ substrate contact 24A and the P doped substrate 8 and provides protection against negative plasma charge damage by enabling conduction of the negative charge to V low. As can be seen in FIG. 3B negative plasma charge on the input line will essentially bias the diode D1 into conduction shunting the charge to the second voltage source, typically ground.

Figure 7A:
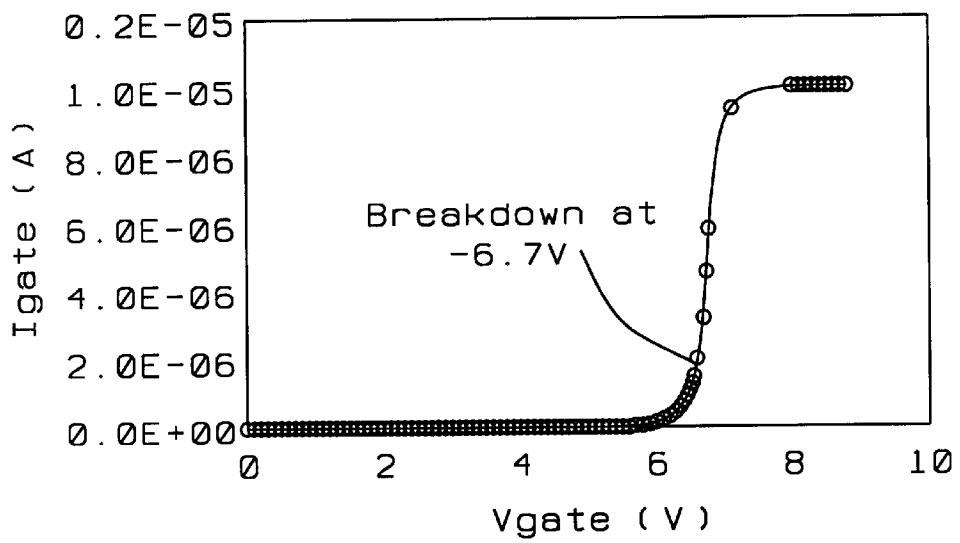
FIG. 7A through 7C shows characteristics of protection devices.
Figure 7B:
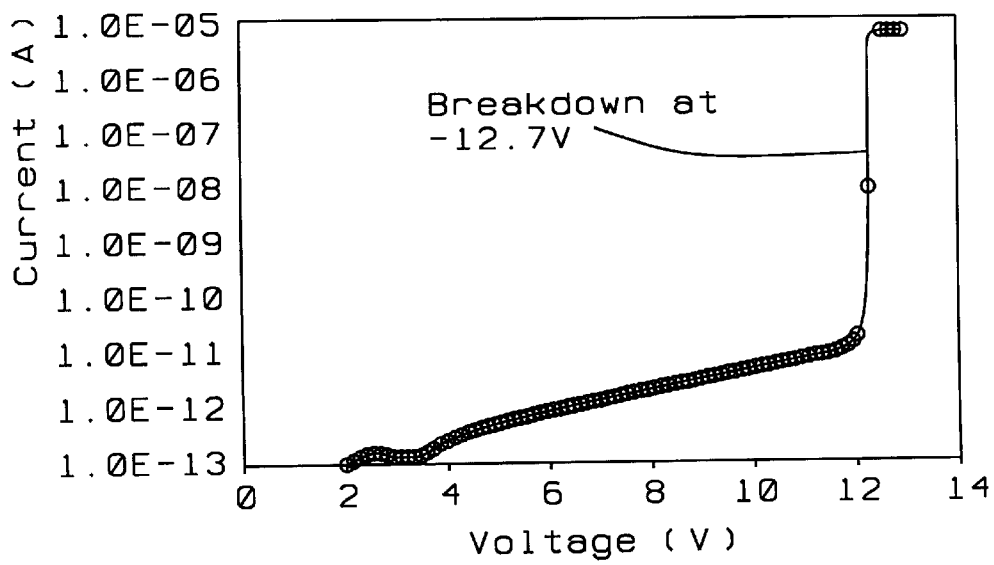
Figure 7C:
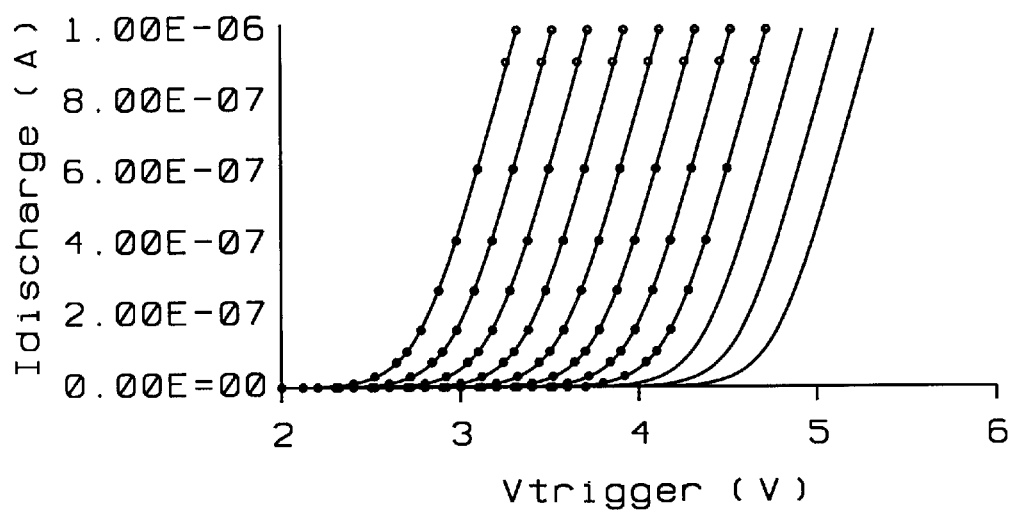

By changing the size and shape of the dummy antenna 28, the trigger voltage of the DLPP device is readily adjusted to a predetermined level suitable to the required application requirements. From actual experimental test results shown in FIG. 7C it can be seen that the trigger voltage of the invention DLPP device can be preset by design in a range of between about −5 volts to a low of about −3 volts. This is well below the typical gate oxide breakdown of about −6.75 volts shown in FIG. 7A and therefore provides excellent protection for the gate oxide.

The N-well 18 functions as a resistive R and capacitive C buffer element to a second voltage source, typically Vss or ground. During normal circuit operation, any charge that would tend to accumulate on the poly gate 20 would be discharged through the N-well resistor R preventing an inversion or accumulation layer from developing under the gate 20. This device characteristic limits leakage during testing or normal circuit operation to very low limits.

An electrical schematic is depicted in FIG. 3B. Depicted are the electrical connection 30 of the input pad to diodes D1, D2 and D3. The gate element 20 with its antenna conductor 28 is connected to the D2 and D3 zener like trigger input point in addition to the N-well resistor and capacitor buffer element which in turn are shown connected to a second voltage source, typically ground.

Figure 3C:
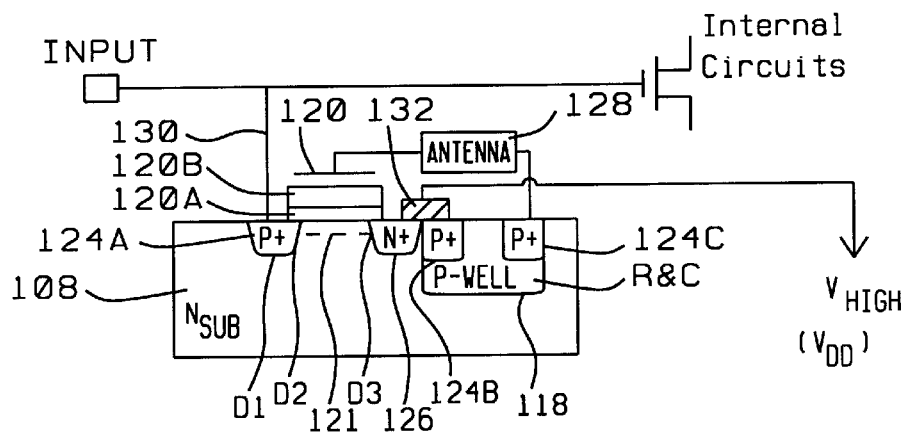
FIG. 3C is a simplified cross section of another embodiment of the invention for a N substrate showing the main electrical elements.

Another embodiment of the invention would be for a N substrate 108 as depicted in FIG. 3C. In this embodiment, a P-well 118 is used for the RC buffer element. The antenna 128 is connected to a P+ contact 124C in the P-well 118 as well as to the poly gate 120. D2 is now formed between the P+ substrate input contact region 124A and the N inversion layer 121 created by a positive gate voltage. D3 is formed between a P accumulation layer 121 and the N+ substrate contact 126. The shorting conductor 132 for the N+ contact 126 and P+ contact 124B is typically connected to the Vdd bus. Care must be taken with the use of this embodiment to ensure that the P+ substrate contact 124A to N substrate 108 diode D1 is reverse biased in normal circuit operation.

Figure 4A:
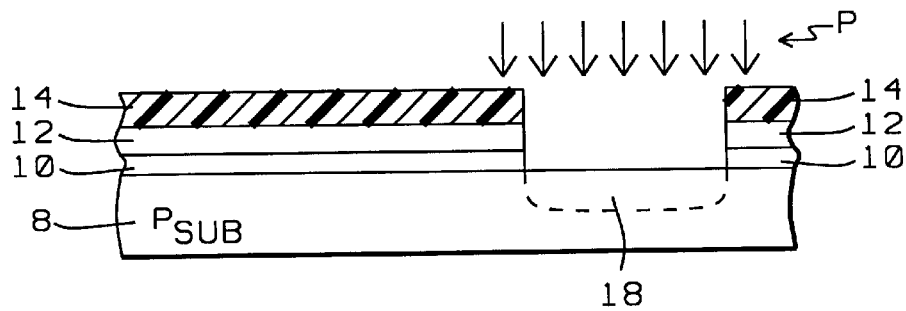
FIG. 4A through 4D are cross sections of the invention utilizing a P doped substrate during various stages of processing.

The process to develop one embodiment of the invention is outlined in FIG. 4A through FIG. 4D which shows the structure for a P substrate in various stages of manufacture. FIG. 4A shows a patterned semiconductor substrate 8 with a nominal P doping level of about 1E15 atoms per cubic centimeter (a/cm$^3$). The substrate surface is covered by a thermally grown or chemical vapor deposition (CVD) first oxide layer 10 sometimes called the pad oxide, which provides thermal stress relief. This layer is typically between 200 to 600 angstroms (Å) in thickness. A CVD layer of silicon nitride (SiN) is placed over the pad oxide as a masking element to a thickness of between 1000 to 2000 Å. This in turn is covered by a conventional photolithographic masking material such as photo resist (PR) 14 with a thickness typically between 4000 and 10,000 Å. The structure as shown in FIG. 4A has been patterned in preparation for the N-well 18 doping. A donor dopent, typically phosphorous (P), is implanted with a typical dosage range of between 1E13 to 1E15 atoms per square centimeter (a/cm$^2$) and with an energy range of between 20 to 50 KeV. This produces a N-well doping density of between 1E16 to 1E18 a/cm$_3$.

Figure 4B:
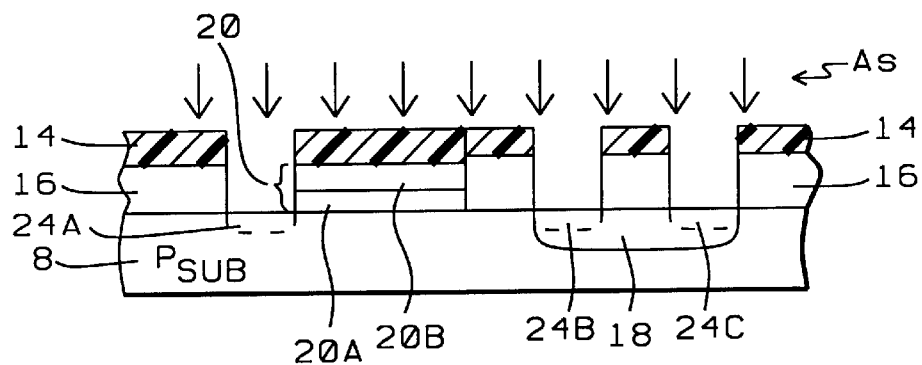

FIG. 4B represents the partially completed device after the N-well masking elements have been removed, the substrate repatterned, and a field oxide 16 has been thermally grown to a thickness of between 5000 and 11000 Å for isolation purposes. A gate oxide layer 20A has then been grown to a thickness of between about 40 to 180 Å, and a layer of polysilicon (poly) 20B has been deposited by CVD to a thickness of between 2000 to 3000 Å to serve as part of the gate conducting element. The N+ contact areas 24A, 24B, 24C have been anisotropically etched typically by means of a reactive ion etch (RIE) using a chlorine or fluorine based gas source. There follows as shown in FIG. 4B an ion implant of a donor element, typically arsenic (As), with a dosage level between about 1E13 to 1E15 a/cm$^2$, with an energy between 20 and 40 KeV. This results in N+ contact regions with a dopent concentration of between about 1E20 and 1E21 a/cm$^3$.

Figure 4C:
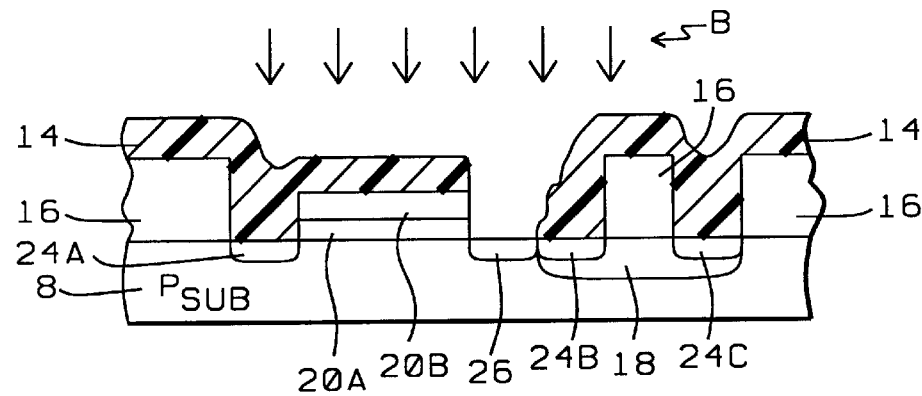

FIG. 4C shows the partially completed device repatterned and etched for the P+ implant. This is done with an acceptor element, typically boron (B) with a dosage of between about 1E12 to 1E13 a/cm$^2$, and an implant energy of between 40 and 80 KeV resulting in a P+ contact area with a dopent concentration of between 1E21 and 1E21 a/cr$^3$.

There then is a repatterning to grow field oxide insulation for the sides of the gate element 20. This is followed by repatterning to etch open contact holes in the oxide to the contact areas 24A, 24B, 24C and the P+ contact 26, typically using a RIE anisotropic etch process. There is a blanket metal deposition, typically using aluminum or silicon doped aluminum, but could be other alloys such as titanium platinum. The main metallurgy system could also be used in conjunction with refractory. type "barrier" metals such as titanium-tungsten (TiW) or titanium nitride (TiN). Most commonly used methods for developing the metallurgy system on the wafer are vacuum evaporation using either filaments, electron beam or flash hot plate as sources, or physical vapor deposition (PVD) commonly known as sputtering. Common sputtering methods would be RF sputtering or magnetron sputtering. With any method, the wafer is blanketed with the metal, then patterned and unwanted metal removed by etching. In addition, the metallurgy layer can be either first layer, second layer or top layer metallurgy.

Figure 4D:
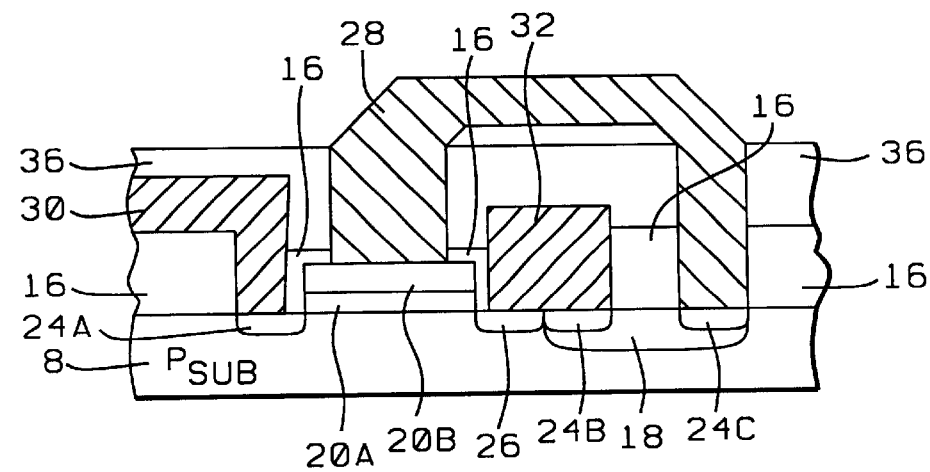

As represented in FIG. 4D, after selective removal of unwanted metal, a final passivation covering layer 36 is deposited, typically SiO$_2$, silicon nitride (SiN), or borophosphorus silicate glass (BPSG). As depicted in FIG. 4D, the gate conductor 28, which also forms the dummy antenna, is connected to the N-well N+ contact 24C. A separate conductor element 30 connects the device to the active circuit input pad, and another conductor element 32 connects the P+ substrate contact 26 to the N-well N+ contact 24B and then to a second voltage source, typically ground.

Figure 5:
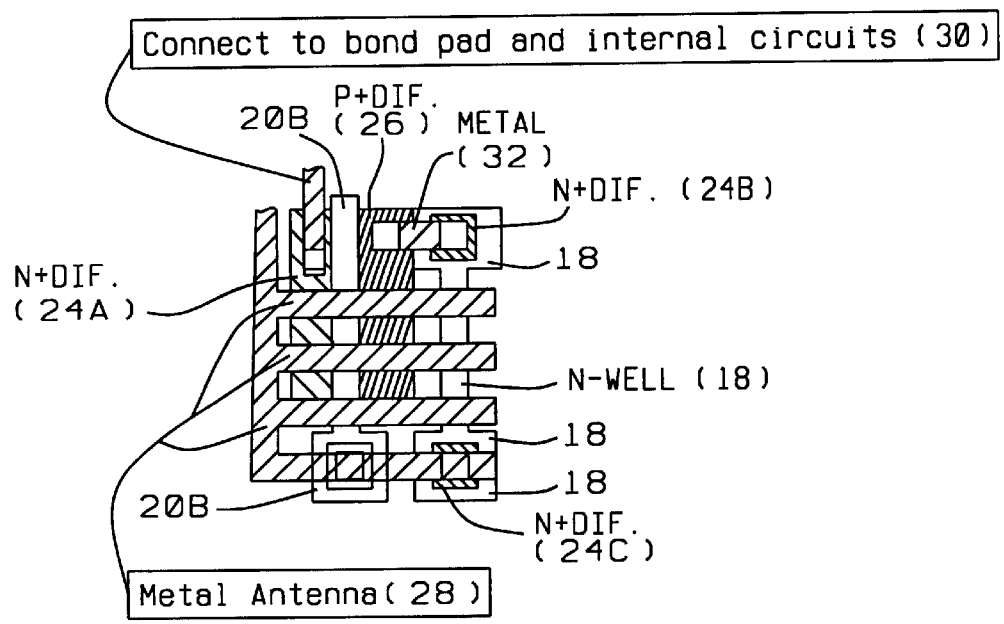
FIG. 5 shows a top view of the horizontal topography of the invention for a P doped substrate.

FIG. 5 shows the top view of the horizontal topography of the DLPP device. The input pad metal 30 is shown connected to the P substrate N+ contact 24A. The pobsilicon gate element 20B extends between the N+ contact 24A and the P+ contact region 26. The N-well 18 extends between the N+ contacts 24B and 24C. The metal antenna 28 is a digitated shape extending over the overall device and is connected to the poly gate element 20B and the N+ N-well contact 24C. Also shown is the conducting element 32 connecting the P+. contact 26 with the N+ N-well contact 24B. This design layout demonstrates an economy of area important to the requirements of decreasing device size and increasing device density while at the same time providing sufficient volume to handle plasma charge current flow.

Figure 6A:
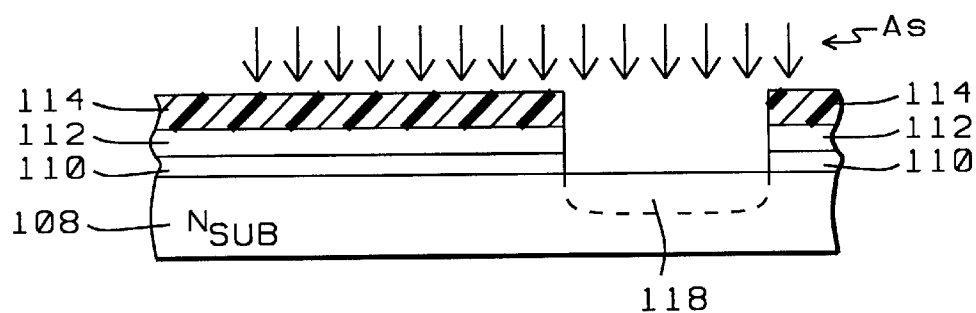
FIG. 6A through 6D shows the development of the structure for another embodiment of the invention using a N doped substrate.

FIG. 6A through 6D shows another embodiment of the invention for a N substrate 108. FIG. 6A shows the substrate 108 which has been covered with a pad oxide 110 with a thickness of between 200 to 600 Å and a SiN layer between 1000 and 2000 Å in thickness. The surface has been patterned with a patterning element, typically photoresist (PR) 124, to a thickness of between about 4000 to 10000 Å to define the P-well area 118. An anisotropic etch, typically RIE, has been performed on the pad oxide 110 and SiN 112 removing them in the P-well area 118. This is followed by an acceptor implant, typically As with a concentration of between about 1E15 and 1E17 a/cm$^2$ and an energy level between 30 and 80 KeV, resulting in a P-well dopent concentration of between 1E16 and 1E18 a/cm$^3$.

Figure 6B:
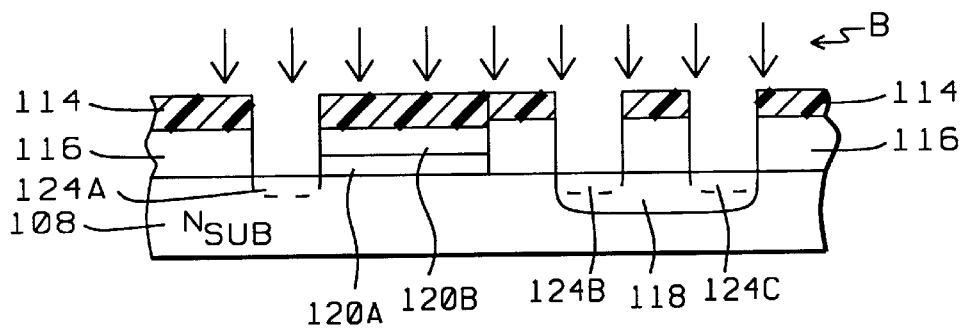
Figure 6C:
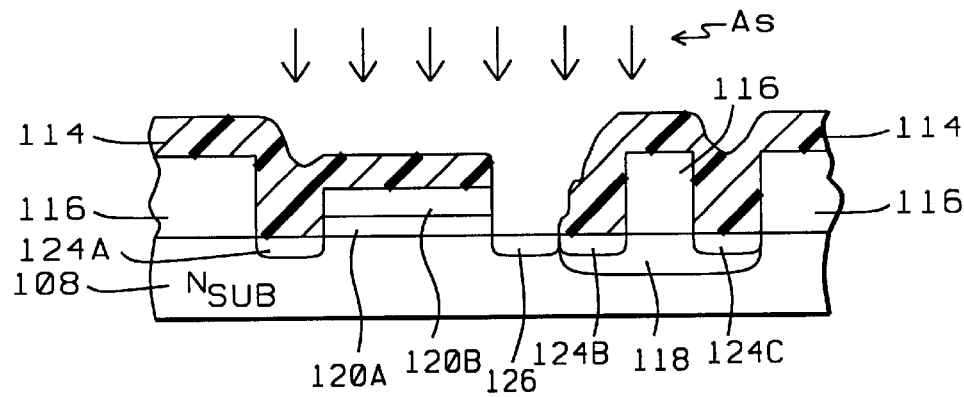

FIG. 6B shows the partially completed structure after field oxide 116, gate oxide, 120A and poly processing, with the structure patterned and etched for the acceptor contact implant. This is done typically with B with a dosage of between about 1E12 and 1E13 a/cm$^2$, and an energy of about 40 to 80 KeV to produce a contact region doping level of between 1E20 and 1E21 a/cm$^3$. As shown in FIG. 6C, the partially completed structure has been repatterned and etched for the N+ contact region 126 implant, typically done with As with a dopent level of between 1E13 and 1E15 a/cm$^2$, and an energy typically between 20 and 40 KeV. This results in a N+ contact area 126 dopent density of between 1E20 and 1E21 a/cm$^3$.

Figure 6D:
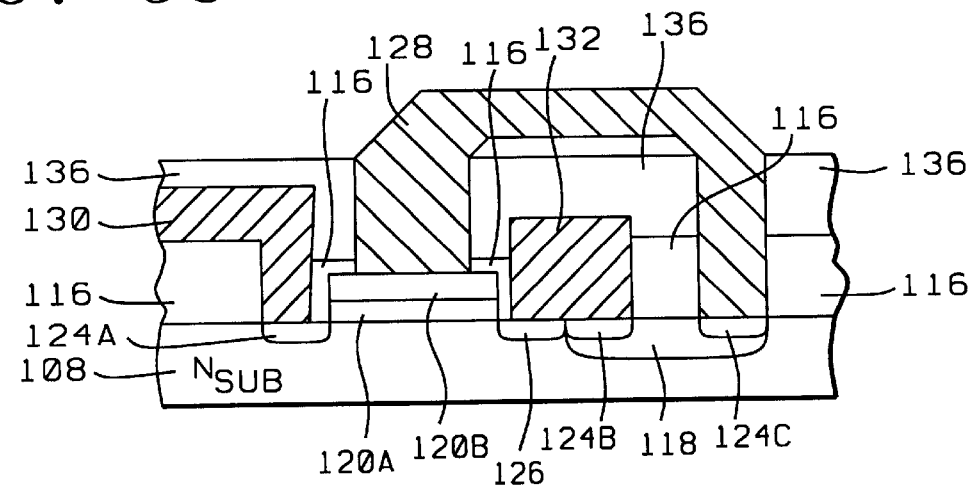

FIG. 6D depicts the structure after reestablishing field oxide 116, depositing patterning and etching metal 128, 130 an[0084] 132, typically aluminum, but could be other metals as previously described, and covering the structure with a passivation layer 136, typically SiO$_2$, or silicon nitride (SiN). or borophosphorus silicate glass (BPSG). As depicted in FIG. 6D, the gate conductor 128, which also forms the dummy antenna, is connected to the N-well N+ contact 124C.

While the invention has been particularly shown and described with reference to the preferred embodiments thereof, it will be understood by those skilled in the art that various changes in form and details may be made without departing from the split and scope of the invention.

What is claimed is:

1. A semiconductor device protection structure on a substrate to protect active devices from plasma charge induced damage comprising:

a first doped region extending down from the surface of said substrate;

an insulating layer for structure element isolation;

a plurality of doped second regions within said first doped region;

a doped third region within said substrate and adjacent to said first doped region;

a doped fourth region within said substrate of opposite doping than said substrate;

a thin insulation layer covered with a crystalline conducting layer on said substrate surface over the area between said third and fourth doped regions;

a first metal conductor element one end of which is connected to said crystalline conducting layer with shape geometry conducive to process charge accumulation and which other end is connected to one said second doped regions;

a second metal conductor element connecting said fourth doped region with said active device input pad;

a third metal conductor element connecting said doped third region with one said doped second region closest to said third doped region and to a second voltage source;

a top passivation layer covering said structure.

2. The protection structure of claim 1 wherein said substrate consists of P doped semiconductor material.

3. The protection structure of claim wherein said first doped region forms a N-well with a dopent concentration of between 1E16 and 1E18 a/cm$^3$ and possessing resistive and capacitive characteristics.

4. The protection structure of claim 1 wherein said insulating layer is field oxide to a thickness between 5000 and 11000 Å.

5. The protection structure of claim 1 wherein said plurality of second doped regions are N+ regions with a dopent concentration of between 1E20 and 1E21 a/cm$^3$.

6. The protection structure of claim 1 wherein said third doped region is a P+ region with a dopent concentration between 1E20 and 1E21 a/cm$^3$.

7. The protection structure of claim 1 wherein said fourth doped region is a N+ region with a dopent concentration of between 1E20 and 1E21 a/cm$^3$ and forms a first diode with said P substrate.

8. The protection structure of claim 1 wherein said thin insulating layer consists of silicon oxide with a thickness between 40 and 180 Å and said crystalline conducting layer consists of polysilicon With a thickness between 2000 and 3000 Å and forms a poly gate element between said third and fourth doped regions.

9. The protection structure of claim 1 wherein said gate element forms a N type inversion layer within said substrate under said gate region for positive plasma charge and forms a P type accumulation layer within said substrate under said gate region for a negative plasma charge.

10. The protection structure of claim 1 wherein the interface between said P type accumulation layer under said gate structure and said N+ doped fourth region forms a second diode element with zener like trigger characteristics.

11. The protection structure of claim 1 wherein the interface between said N type inversion layer under said gate structure and said P+ doped third region forms a third diode element with zener like trigger characteristics.

12. The protection structure of claim 1 wherein said first metal conductor element can be a first or second layer or top metal layer, and said metal charge accumulation element acts as an antenna collecting a portion of said plasma charge to provide a voltage for said poly gate.

13. The protection structure of claim 1 wherein the shape and size of said metal antenna controls the amount of charge collected and thereby controls the voltage of said gate and trigger voltage of said protection device.

14. The protection structure of claim 1 wherein said top passivation layer covering said structure consists of SiO$_2$ or silicon nitride or borophosphorus silicate glass with a thickness of between 3000 and 7000 Å.

15. A semiconductor device protection structure on a N doped semiconductor substrate for active device protection from plasma induced damage comprising:

a first region of P doping extending down from the surface of said N doped substrate;

an insulating layer for structure element isolation;

a plurality of P+ doped second regions within said P doped first region;

a doped N+ third region within said substrate and adjacent to said first P doped region a P+ doped fourth region within said substrate;

a thin oxide insulation layer covered with a polysilicon conducting layer forming a gate element on said substrate surface over the area between said N+ doped third region and said P+ fourth region;

a first metal conductor element one end of which is connected to said gate polysilicon conducting layer with shape geometry conducive to process charge accumulation and which other end is connected to one said P+ doped second regions;

a second metal conductor element connecting said P+ doped fourth region with active device input pad;

a third metal conductor element connecting said N+ doped third region with one said P+ doped second region closest to said third region and to a second voltage source;

a top passivation layer covering said structure.

16. The protection structure of claim 15 wherein said first P-doped region forms a P-well within said N doped substrate with a dopent concentration of between 1E16 and 1E18 a/cm$^3$ and possessing resistive and capacitive characteristics.

17. The protection structure of claim 15 wherein said insulating layer is field oxide to a thickness between 5000 and 11000 Å.

18. The protection structure of claim 15 wherein said plurality of doped P+ second regions have a dopent concentration of between 1E20 and 1E21 a/cm$^3$.

19. The protection structure of claim 15 wherein said N+ doped third region has a dopent concentration between 1E20 and 1E21 a/cm.

20. The protection structure of claim 15 wherein said fourth P+ doped region has a dopent concentration of between 1E20 and 1E21 a/cm$^3$ and forms a first diode with said N substrate.

21. The protection structure of claim 15 wherein said gate element oxide insulation layer is between 40 and 180 Å in thickness and said gate polysilicon layer is between 2000 and 3000 Å in thickness and which said gate element forms a N type inversion layer within said substrate under said gate region for a positive plasma charge and forms a P type accumulation layer within said substrate under said gate region for a negative plasma charge.

22. The protection structure of claim 15 wherein the interface between said fourth P+ region and said N type inversion layer under said gate structure forms a second diode element with zener like trigger characteristics.

23. The protection structure of claim 15 wherein the interface between said N+ doped third region and said P type accumulation layer under said gate structure forms a third diode element with zener like trigger characteristics.

24. The protection structure of claim 15 wherein said first metal conductor element can be a first or second or top metal layer, and said metal charge accumulation element area acts as an antenna collecting a portion of said plasma charge to provide a voltage for said poly gate.

25. The protection structure of claim 15 wherein the shape and size of said metal antenna controls the amount of charge collected and thereby controls the voltage of said gate and trigger voltage of said protection device.

26. The protection structure of claim I wherein said top passivation layer covering said structure consists of SiO$_2$ or silicon nitride or borophosphorus silicate glass.

27. A method of fabricating a diode like protection device on a P doped semiconductor substrate to protect active semiconductor devices from plasma charge induced damage comprising:

forming a first doped region on said semiconductor substrate;

forming an insulating layer on said substrate for element isolation;

forming a plurality of doped second regions within said doped first region;

providing a doped third region within said substrate and adjacent to said first doped region;

providing a doped fourth region within said substrate of opposite doping than substrate providing a thin insulating silicon oxide layer covered by a conducting polysilicon layer on said substrate over the region between said third and fourth doped regions;

forming an insulating layer over said substrate surface;

forming a first metal conductor element for gate conductor, charge accumulation antenna and one second region contact;

forming a second metal conductor element for the doped fourth region input contact;

forming a third metal conductor element for one said doped second area, and doped third area contact to a second voltage source;

covering the structure with a passivation layer.

28. The method according to claim 27 whereby said doped first region is. doped with a donor dopent such as phosphorous with a doping level between 1E16 and 1E18 a/cm$^2$ to form a N-well region with a dopent concentration between 1E16 and 1E18 a/cm$^3$.

29. The method according to claim 27 whereby said insulating layer for element isolation is field oxide wet thermally grown to a thickness between 5000 and 11000 Å in thickness.

30. The method according to claim 27 whereby said plurality of doped second regions and said fourth region are doped by ion implant with a donar dopent of arsenic with a dosage between 1E13 and 1E15 a/cm$^2$ and with an energy level between 20 and 40 KeV to form N+ regions.

31. The method according to claim 27 whereby said doped third region is created with a donor dopent typically boron with a dosage between 1E12 and 1E13 a/cm$^2$ and an energy level of between 40 and 80 KeV.

32. The method according to claim 27 whereby said silicon oxide insulator layer is thermally grown to a thickness of between 40 to 180 Å.

33. The method according to claim 27 whereby said poly layer gate element is deposited by CVD to a thickness of 2000 to 3000 Å and is doped with phosphorous to produce a dopent density of between 1E17 and 1E21 a/cm$^3$.

34. The method according to claim 27 whereby said metallurgy system is deposited using blanket evaporation and is doped with 1% silicon.

35. The method according to claim 27 whereby said first, second and third metal conductor elements are formed by patterning and plasma etching.

36. The method according to claim 27 whereby said passivation layer is silicon nitride deposited by LPCVD using a silane and ammonium source or dichlorosilane source at a temperature between 400 and 700° C.

37. The method according to claim 27 whereby said passivation layer is SiO$_2$ deposited LPCVD using TEOS as a source at a temperature between 400 and 700° C.

38. The method according to claim 27 whereby said passivation layer is borophosphorus silicate glass deposited by LPCVD using dichlorosilane with nitrous oxide and phosphine and diborane at a temperature between 400 and 700° C.

39. A method of fabricating a diode like protection device on a N doped semiconductor substrate to protect active semiconductor devices from plasma charge induced damage comprising:

forming a first doped P region on said semiconductor substrate;

forming an insulating layer on said substrate for element isolation;

forming a plurality of P+ doped second regions within said doped first region;

providing a doped N+ third region within said substrate and adjacent to said first P doped region;

providing a P+ doped fourth region within said substrate;

providing a thin insulating silicon oxide layer covered by a conducting polysilicon layer on said substrate over the region between said third and fourth doped regions;

reforming an insulating layer over said substrate surface;

forming a first metal conductor element for gate conductor, charge accumulation antenna and one said second region contact;

forming a second metal conductor element for the doped fourth region input contact;

forming a third metal conductor element connecting one said doped second region and said third doped region and to connect to a second voltage source;

covering the structure with a passivation layer.

40. The method according to claim 39 whereby said doped first region is doped with an acceptor dopent such as boron with a doping level between 1E16 and 1E18 a/cm$^2$ to form a P-well region with a dopent concentration between 1E16 and 1E18 a/cm$^3$.

41. The method according to claim 39 whereby said insulating layer for element isolation is field oxide wet thermally grown to a thickness between 5000 and 11000 Å in thickness.

42. The method according to claim 39 whereby said plurality doped second regions and fourth region are doped by ion implant with a donar dopent of boron with a dosage between 1E13 and in 1E15 a/cm$_2$ and with an energy level between 20 and 40 KeV to form N+ regions with a dopent concentration between 1E20 and 1E21 a/cm$^3$.

43. The method according to claim 39 whereby said doped third region is created with arsenic with a dosage between 1E13 and 1E15 a/cm$_2$ and an energy level of between 20 and 40 KeV to produce a N+ doping concentration of between 1E21 and 1E22 a/cm$^3$.

44. The method according to claim 39 whereby said silicon oxide insulator layer is thermally grown to a thickness of between 40 to 180 Å.

45. The method according to claim 39 whereby said poly layer gate element is deposited by CVD to a thickness of 2000 to 3000 Å using and is doped with phosphorous to produce a doping density of between 1E17 and 1E21 a/cm$^3$.

46. The method according to claim 39 whereby said insulating layer consists of SiO$_2$ to a thickness of between 5000 to 11000 Å.

47. The method according to claim 39 whereby said metallurgy system is deposited using blanket evaporation and is doped with 1% silicon.

48. The method according to claim 39 whereby said first, second and third metal conductor elements are formed by patterning and plasma etching.

49. The method according to claim 39 whereby said passivation layer is silicon nitride deposited by LPCVD using a silane and ammonium source or dichlorosilane source at a temperature between 400 and 700° C.

50. The method according to claim 39 whereby said passivation layer is $SiO_2$ deposited LPCVD using TEOS as a source at a temperature between 400 and 700° C.

51. The method according to claim 39 whereby said passivation layer is borophosphorus silicate glass deposited by LPCVD using dichlorosilane with nitrous oxide and phosphine and diborane at a temperature between 400 and 700° C.

* * * * *